United States Patent
Nekado et al.

(10) Patent No.: US 6,788,053 B2
(45) Date of Patent: Sep. 7, 2004

(54) MAGNETIC FLUX MEASURING DEVICE

(75) Inventors: Yasuo Nekado, Kanagawa (JP); Masaaki Kusumi, Kanagawa (JP); Ken Onoe, Tokyo (JP)

(73) Assignee: Sony Precision Technology Inc., Tokyo (JP)

( * ) Notice: Subject to any disclaimer, the term of this patent is extended or adjusted under 35 U.S.C. 154(b) by 0 days.

(21) Appl. No.: 10/183,743

(22) Filed: Jun. 25, 2002

(65) Prior Publication Data

US 2003/0006765 A1 Jan. 9, 2003

(30) Foreign Application Priority Data

Jun. 25, 2001 (JP) .................................. P2001-191680

(51) Int. Cl.[7] ............................................. G01R 33/02
(52) U.S. Cl. .................................... 324/256; 324/244
(58) Field of Search ................ 318/135; 310/12–14; 335/282; 324/256, 257; 33/355 R; 236/234; 260/228

(56) References Cited

U.S. PATENT DOCUMENTS

| 3,727,982 | A | * | 4/1973 | Itoh et al. ................... 299/14 |
| 4,281,242 | A | * | 7/1981 | Mannion ..................... 235/449 |
| 4,931,730 | A | * | 6/1990 | Olsen et al. ................. 324/209 |
| 5,218,296 | A | * | 6/1993 | Shinde et al. ............... 324/239 |
| 5,394,083 | A | * | 2/1995 | Jiles ........................... 324/223 |
| 5,399,968 | A | * | 3/1995 | Sheppard et al. ........... 324/242 |
| 5,430,278 | A | * | 7/1995 | Krieg et al. ................. 235/449 |

* cited by examiner

Primary Examiner—N. Le
Assistant Examiner—Reena Aurora
(74) Attorney, Agent, or Firm—Haverstock & Owens LLP

(57) ABSTRACT

A sensor coil is provided on a core which forms a magnetic circuit for driving a linear motor, and the core is excited by electrifying the sensor coil at a high frequency. The high-frequency excitation is carried out in such a manner that the sensor coil is not magnetically saturated, and an eddy current is generated in the core. The impedance of the sensor coil is detected in this state and the quantity of a magnetic flux generated in the core constituting the magnetic circuit is detected on the basis of the impedance. Thus, the influence on the magnetic circuit itself is reduced and higher accuracy, miniaturization and lower power consumption are realized.

5 Claims, 3 Drawing Sheets

MAGNETIC FLUX MEASURING DEVICE

BACKGROUND OF THE INVENTION

1. Field of the Invention

This invention relates to a magnetic flux measuring device for measuring the quantity of a magnetic flux passing through a magnetic circuit.

2. Description of the Related Art

As techniques for measuring the quantity of a magnetic flux generated in a magnetic circuit, a "search coil system", a "supersaturated sensor system", and a "magnetically sensitive element system" have been conventionally used.

In the "search coil system", a coil is wound on a member constituting a magnetic circuit as a measuring object, and an induced electromotive force generated by the change in quantity of the magnetic flux passing through this member is detected from the coil. In the "search coil system", the quantity of the magnetic flux in the magnetic circuit is measured by integrating the induced electromotive force generated on the coil.

In the "supersaturated sensor system", a coil is wound on a saturable magnetic material constituting a magnetic circuit as a measuring object. The coil is electrified by a driving circuit to excite the magnetic material to a magnetically saturated state. When the magnetic material is excited to a magnetically saturated state, the impedance of the coil is lowered. Moreover, if the original passing magnetic flux through the magnetic circuit is offset and added, the time of the magnetic saturation of the magnetic material changes. The longer the time of the magnetic saturation is, the lower the impedance of the coil becomes. That is, the impedance of the coil changed in accordance with the quantity of the original passing magnetic flux through the magnetic circuit. In the "supersaturated sensor system", the quantity of the magnetic flux in the magnetic circuit is measured by detecting the impedance of the coil.

In the "magnetically sensitive element system", a gap is formed in a magnetic circuit as a measuring object and a sensor which is sensitive to magnetism such as a Hall element or an MR element is inserted into the gap, or a sensor which is sensitive to the magnetism is arranged near the magnetic circuit as a measuring object. The output of the sensor inserted or arranged in the gap or the like changes in accordance with the magnetic flux generated in the gap or the like. In the "magnetically sensitive element system", the quantity of the magnetic flux in the magnetic circuit is measured by detecting the sensor output.

The above-described systems have the following problems.

Since the "search coil system" uses electromagnetic induction due to the magnetic flux passing through the magnetic circuit, an output can be obtained when the magnetic flux varies temporally, whereas an output cannot be obtained when the magnetic flux does not vary temporally. That is, the quantity of the unvaried magnetic flux cannot be measured. Moreover, even if the magnetic flux varies temporally, it is difficult to provide sufficient sensitivity when the quantity of temporal change is small. By increasing the number of turns of the wound coil, sufficient sensitivity may be provided even when the quantity of the temporal change is small. In such a case, however, the coil must be increased in size.

In the "supersaturated sensor system", the saturable magnetic material as the member constituting the magnetic circuit must be magnetically saturated. Therefore, if the magnetic material has, for example, a property of moderate magnetic saturation, that is, if the magnetic material requires application of a large magnetic field to be magnetically saturated (for example, electromagnetic copper plate, silicon copper plate or pure iron), a current flowing through the coil must be increased or the number of turns of the coil must be increased. This leads to increase in size of the device, deterioration in durability of the electric circuit and increase in power consumption. Moreover, even if a high permeable magnetic material which is magnetically saturated by a small magnetic field is used as the saturable magnetic material, similar problems arise when the magnetic material itself is large.

Furthermore, in the "supersaturated sensor system", a large number of magnetic fluxes which cause disturbance are generated in the magnetic circuit, other than the originally generated magnetic flux in the magnetic circuit. These magnetic fluxes might adversely affect the proper operation of the magnetic circuit itself.

In the "magnetically sensitive element system", since the sensor is inserted in the gap in the magnetic circuit as a measuring object or arranged near the magnetic circuit, practically, a leakage flux of the magnetic circuit is detected. However, since the B-H characteristic of the magnetic material is nonlinear, the actual magnetic flux generated in the magnetic circuit is not coincident with the leakage flux, causing a measurement error.

SUMMARY OF THE INVENTION

In view of the foregoing status of the art, it is an object of the present invention to provide a magnetic flux measuring device for measuring the quantity of a magnetic flux passing through a magnetic circuit, which reduces influence on the magnetic circuit itself and realizes higher accuracy, miniaturization and lower power consumption.

In order to solve the above-described problems, the present inventor proposes the following invention.

First, a conductive core is provided on a member which forms a magnetic circuit as a measuring object. By thus providing the core on the member which forms the magnetic circuit, a magnetic flux generated in the magnetic circuit directly passes through the core. Any method for providing the core on the member may be used as long as the magnetic flux passing through the magnetic circuit directly passes through the core. For example, the member may be cut out to form a core so that a part of the member is used as the core. Alternatively, a core which is separate from the member may be inserted in the member.

Then, a coil is wound on the core and the coil is electrified at a high frequency to excite the core. The impedance of the coil at this point is detected.

The excitation of the core is carried out in consideration of the number of turns of the wound coil, the size and material of the coil, and electrical characteristics such as frequency, current and voltage of excitation driving means, and in such a manner that the core is not magnetically saturated. As the core is excited at a high frequency, the impedance of the coil includes the change in eddy current due to the conductivity of the core itself, in addition to an impedance change accompanied by self-induction. The values of these two components change with the permeability $\mu$ of the core material. Particularly, when the core is excited in such a manner that the core is not magnetically saturated, the impedance of the coil depends greatly on the change in eddy current. The value of the permeability $\mu$ of the core material changes with the quantity of the magnetic flux flowing into the core. That is, the impedance of the coil vanes with the quantity of the magnetic flux flowing into the core without magnetically saturating the core material.

According to the present invention, the impedance of the coil is detected in the above-described state and the quantity of the magnetic flux generated in the member constituting the magnetic circuit is detected on the basis of the impedance.

The above-described present invention may be realized as follows.

Specifically, a magnetic flux detecting device according to the present invention is adapted for measuring the quantity of a magnetic flux in a magnetic path forming part which forms a magnetic path and is provided within a magnetic circuit, the device comprising: magnetically sensitive means made of a conductive magnetic material and constituted by a sensor core provided on the magnetic path forming part and a sensor coil wound on the sensor core; high-frequency electrifying means for electrifying the sensor coil at a high frequency; and a magnetic flux quantity detecting means for detecting the impedance of the sensor coil and detecting the quantity of a magnetic flux in the magnetic path forming part on the basis of the impedance; the sensor core not being magnetically saturated when the sensor coil is electrified at a high frequency by the high-frequency electrifying means.

In the magnetic flux detecting device according to the present invention, a core made of a conductive magnetic material is provided on a magnetic path forming part forming a magnetic circuit. A sensor coil is wound on the core and the sensor coil is electrified at a high frequency in such a manner that the core is not magnetically saturated. The impedance of the coil is detected and the quantity of a magnetic flux in the magnetic path forming part is detected on the basis of the impedance.

Thus, the magnetic flux detecting device according to the present invention can reduce the influence on the magnetic circuit itself and can realize higher accuracy, miniaturization and lower power consumption.

DESCRIPTION OF THE PREFERRED EMBODIMENT

A moving-coil linear DC motor to which the present invention is applied will now be described as an embodiment of the present invention.

A moving-coil linear DC motor has a field magnet that operates as a fixed member while a coil operates as a moving member. Said DC motor controls the operation of the moving coil with a DC current flowing through the coil.

Figure 1:
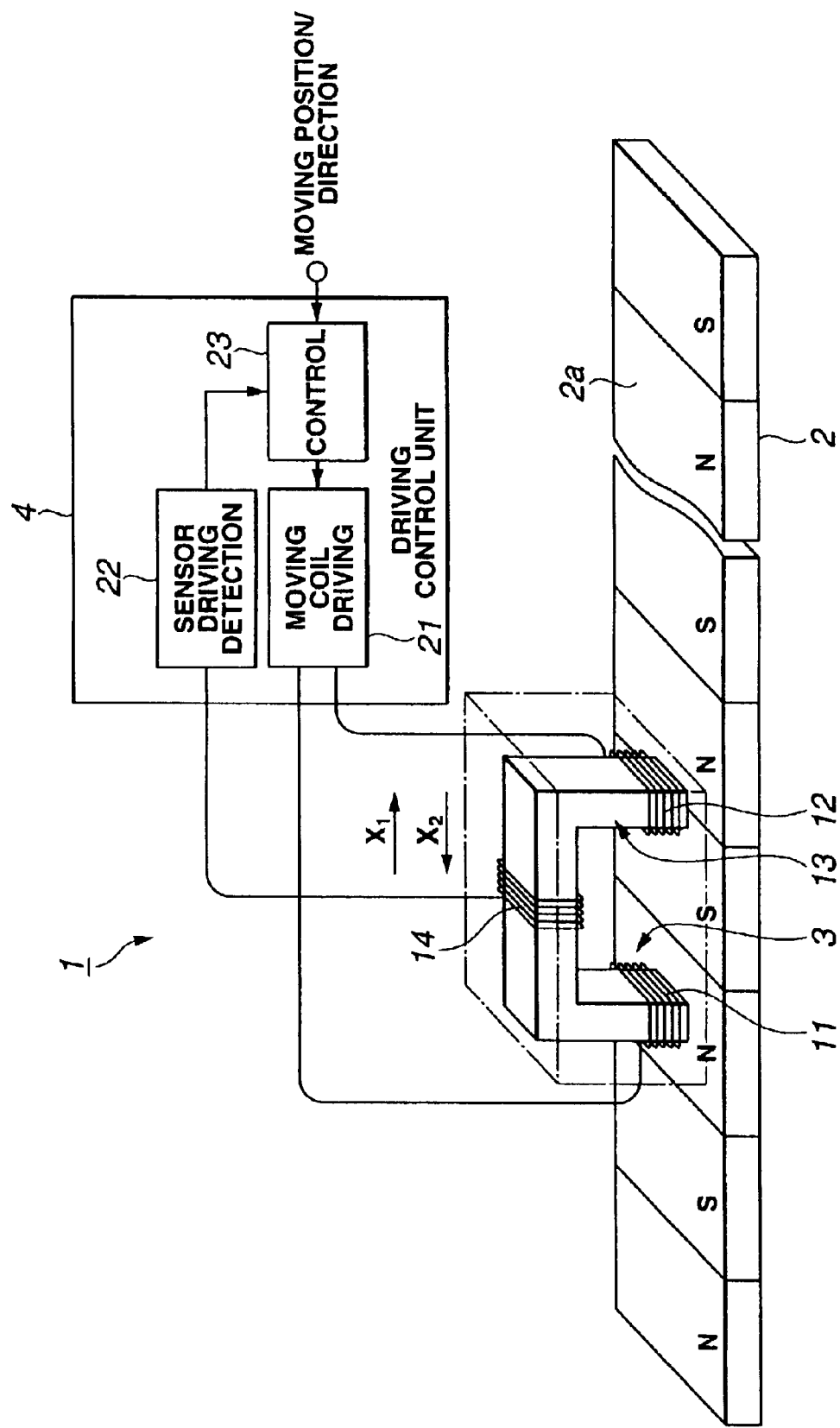
FIG. 1 shows the schematic structure of a moving-coil linear DC motor to which the present invention is applied.

FIG. 1 shows the structure of the moving-coil linear DC motor.

The moving-coil linear DC motor 1 of the present embodiment has a field magnet 2, a slider 3, and a driving control unit 4, as shown in FIG. 1.

The field magnet 2 is made of a magnetic material, for example, in the shape of a long flat plate. The field magnet 2 is magnetized in the direction of thickness so that a north pole and a south pole appear alternately at a predetermined pitch along the longitudinal direction on its major surface 2a.

The slider 3 is provided at a position facing the major surface 2a of the field magnet 2. The slider 3 is movable in the longitudinal direction of the field magnet 2, guided by a guide rail or the like, not shown. Specifically, the slider 3 is movable in directions X1, X2 in FIG. 1. Hereinafter, the directions X1, X2 may also be referred to as moving directions. The slider 3 has therein two moving coils 11, 12, a core 13, and a sensor coil 14.

The moving coils 11, 12 are, for example, rectangularly wound coils. In the moving coils 11, 12, the central axis is provided in the direction orthogonal to the major surface 2a of the field magnet 2, and one predetermined side of the rectangle and a side facing the one side (magnetically sensitive sides) are provided orthogonally to the moving directions X1, X2. The moving coils 11, 12 are provided close enough to the major surface 2a of the field magnet 2. The moving coils 11, 12 are provided so that a pitch between the two sides (magnetically sensitive sides) facing the moving directions X1, X2 and the distance between the two moving coils with respect to the moving directions X1, X2 have a phase difference of 90 degrees to the NS magnetization cycle of the field magnet 2. Therefore, a thrust in the moving directions X1, X2 is generated in the slider 3 by the magnetic field generated from the field magnet 2 and the current flowing through the magnetically sensitive sides of the moving coils 11, 12 according to the Fleming's left-hand rule.

The core 13 is substantially U-shaped. The core 13 is provided vertically on the major surface 2a of the field magnet 2, with both ends of the core 13 inserted in the two moving coils 11, 12.

The sensor coil 14 as shown is wound on the core 13 substantially at its center which is at an equal distance from both ends of the core 13. The sensor coil 14 may be provided at any position within a magnetic path formed by the core 13.

The driving control unit 4 has a moving coil driving circuit 21, a sensor driving detection circuit 22, and a control circuit 23.

The moving coil driving circuit 21 supplies a driving DC current for generating a thrust to the moving coils 11, 12.

The sensor driving detection circuit 22 electrifies the sensor coil 14 at a high frequency and thus excites the core 13. Along with this, the sensor driving detection circuit 22 detects the impedance of the sensor coil 14.

The control circuit 23 controls the driving current supplied from the moving coil driving circuit 21 to the moving coils 11, 12 so as to move the slider 3 to a predetermined position in a predetermined direction on the basis of control information such as moving position information and moving direction information inputted from outside. The control circuit 23 also detects the quantity of a magnetic flux generated in the core 13 on the basis of the impedance of the sensor coil 14 detected by the sensor driving detection circuit 22. Then, the control circuit 23 controls the current supplied to the moving coils 11, 12 in accordance with the quantity of the magnetic flux and stabilizes the thrust of the slider 3.

Since the thrust of the slider 3 is given by the Fleming's left-hand rule, it is proportional to the quantity of the magnetic flux supplied from the field magnet 2 to the moving coils 11, 12 and the quantity of the current supplied to the moving coils 11, 12. As the core 13 is provided, the quantity of the magnetic flux supplied to the moving coils 11, 12 is considered to be equivalent to the quantity of the magnetic flux passing through the magnetic circuit constituted by the field magnet 2 and the core 13. Since the north pole and the south pole are alternately magnetized on the major surface 2a, the magnetic flux provided to the moving coils 11, 12 varies in accordance with the moving position. That is, if the quantity of the current flowing through the moving coils 11, 12 is constant, the thrust varies in accordance with the moving position of the slider 3. Thus, the control circuit 23 detects the quantity of the magnetic flux in the magnetic circuit and controls the driving current supplied to the moving coils 11, 12 in accordance with the detected quantity of the magnetic flux, thus stabilizing the thrust of the slider.

As described above, in the moving-coil linear DC motor 1 of the embodiment of the present invention, the slider 3 can be freely moved to each position in the longitudinal direction of the field magnet 2 while the thrust is stabilized.

A method for measuring the quantity of the magnetic flux passing through the magnetic circuit employed in the embodiment of the present invention will now be described further in detail.

In the method for measuring the quantity of the magnetic flux passing through the magnetic circuit employed in the embodiment of the present invention, first, a conductive sensor core is provided on a member constituting a magnetic circuit as a magnetic flux measuring object. Then, a sensor coil is wound on the sensor core. The sensor core is provided on the member so that a magnetic flux passing through the magnetic circuit directly passes through the sensor core. The material of the sensor core may be any magnetic material that is conductive. For example, the sensor core may be made of a high permeable magnetic material such as pure iron, permalloy, or amorphous metal.

In the moving-coil linear DC motor 1 of the present embodiment, since the magnetic circuit consists of the field magnet 2 and the core 13, the sensor core is provided on the core 13, which is a member constituting the magnetic circuit.

The sensor core may be provided in any manner, provided a magnetic flux passing through the magnetic circuit directly passes through the sensor core. In the present embodiment, the sensor core 14 is wound on the core 13 itself, a member that forms the magnetic circuit as shown in FIG. 1, thus providing the sensor core.

Figure 2:
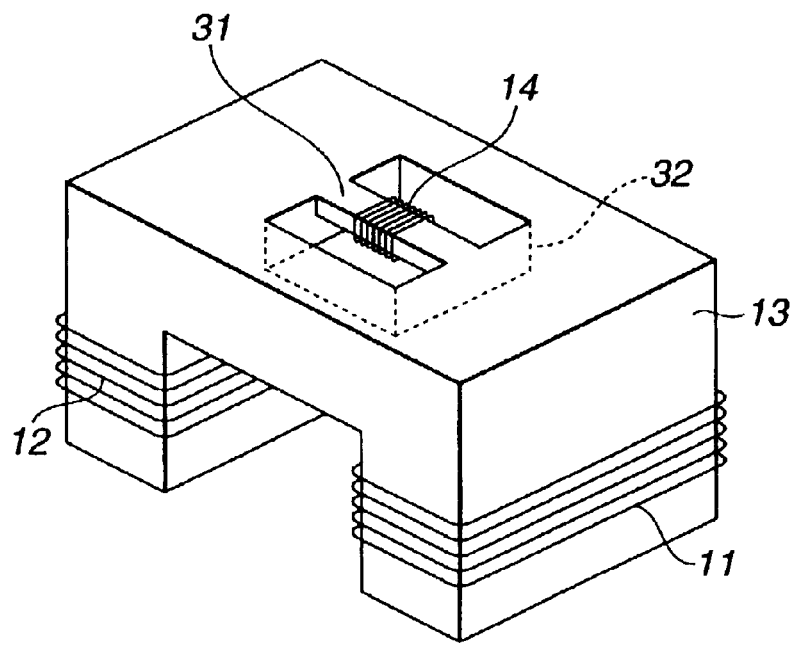
FIG. 2 illustrates an exemplary method for forming a sensor coil.

Alternatively, a part of the member (for example, core 13) constituting the magnetic circuit may be cut out to form a sensor core 31, for example, as shown in FIG. 2. Specifically, a recess 32 is formed in core 13 and the sensor core 31 bridging the recess 32 in the passing direction of the magnetic field may be formed integrally with the core 13. By thus providing the sensor core, the sensor coil is miniaturized even if the member constituting the magnetic circuit is large.

Figure 3:
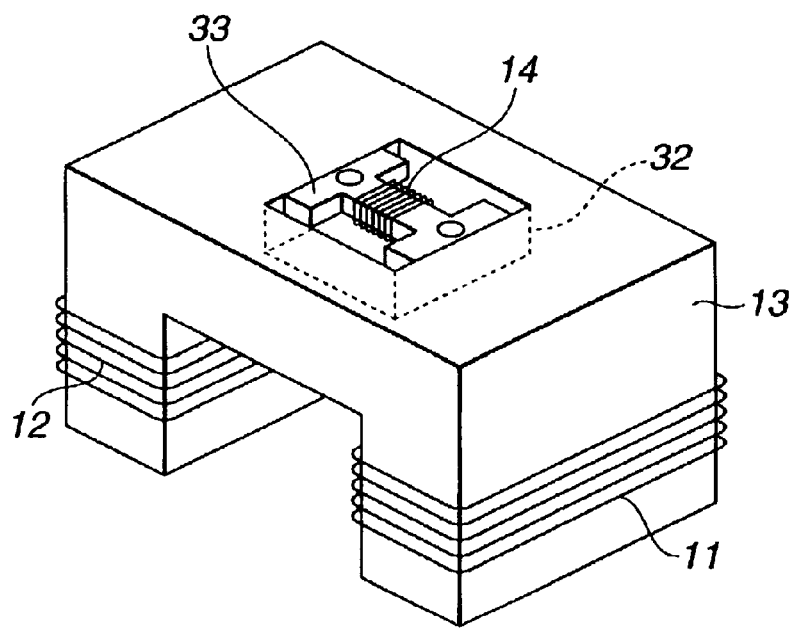
FIG. 3 illustrates another exemplary method for forming the sensor coil.

As still another method for providing the sensor core, a sensor core 33 formed as a separate body from the member (for example, core 13) constituting the magnetic circuit may be inserted in the member, for example, as shown in FIG. 3. Specifically, the sensor core 33 may be inserted in the core 13 by forming a recess 32 in the core 13 and attaching the sensor core 33, as a separate member from the core 13, in the recess 32 in the passing direction of the magnetic field. By thus providing the sensor core, the sensor coil can be wound on the sensor core in advance and handling thereof is facilitated.

Moreover, in the method for measuring the quantity of the magnetic flux passing through the magnetic circuit employed in the embodiment of the present invention, the sensor coil is electrified at a high frequency to excite the sensor core and the impedance of the sensor coil electrified at a high frequency is detected. Then, on the basis of the detected impedance, the quantity of the magnetic flux generated in the magnetic circuit is detected.

Figure 4:
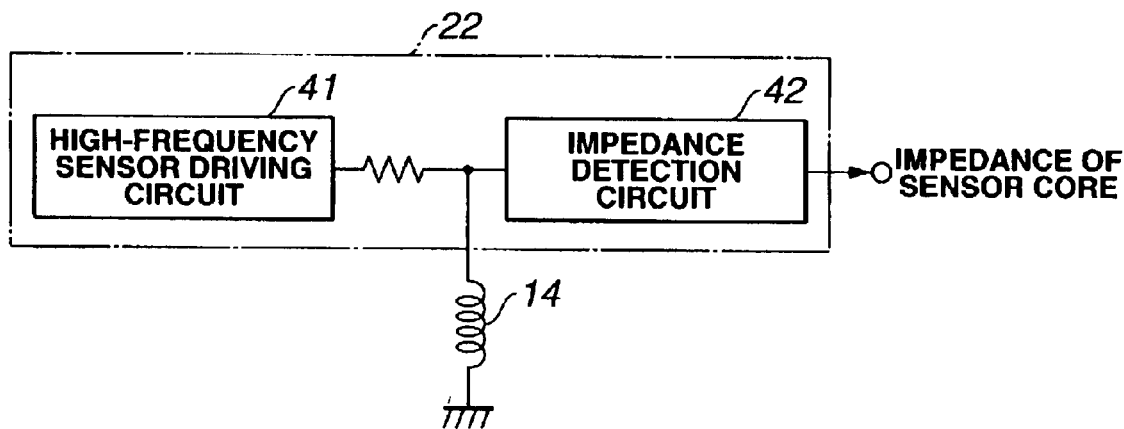
FIG. 4 illustrates an exemplary structure of a sensor driving detection circuit.

In the moving-coil linear DC motor 1 of the present embodiment, the high-frequency electrification and detection of impedance are carried out by the sensor driving detection circuit 22. The sensor driving detection circuit 22 drives the sensor core 14 by using a high-frequency sensor driving circuit 41 and detects the output of the sensor core 14 by using an impedance detection circuit 42, thus detecting the impedance, as shown in FIG. 4. In the moving-coil linear DC motor 1 of the present embodiment, the control circuit 23 detects the quantity of the magnetic flux on the basis of the impedance detection output from the sensor driving detection circuit 22.

The waveform of a signal driving the coil sensor may be a sine wave or a square wave, provided it drives at a high frequency. However, a square wave is more advantageous in that the circuit can be provided easily and inexpensively, that the sensor can be efficiently driven by a high-frequency component contained in a pulse, and that both a higher frequency and reduced power consumption can be realized by adjusting the repetitive frequency and the pulse duty.

Figure 5:
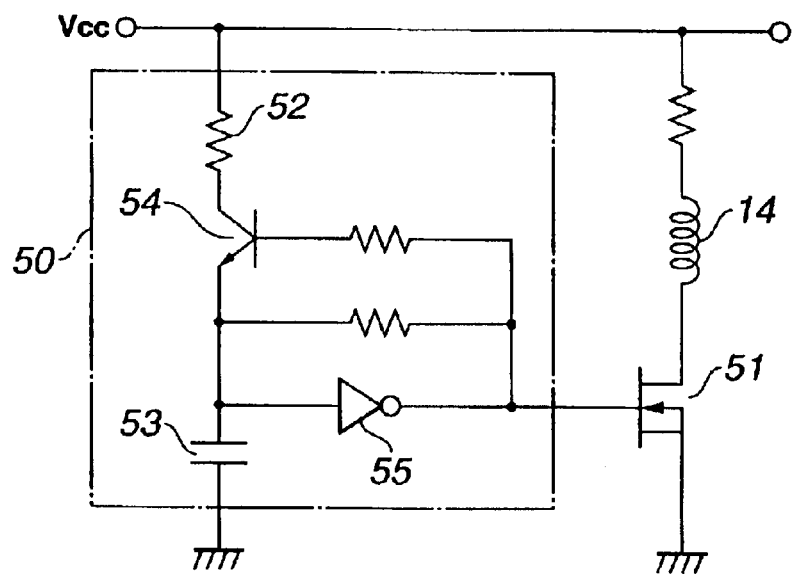
FIG. 5 illustrates an exemplary structure of an oscillation circuit of the sensor driving detection circuit.

The circuit for driving the sensor may be any circuit such as a Colpitts oscillator, a multivibrator circuit, or an oscillation circuit using a crystal oscillator. For example, an FET 51 may be used that is serially connected to an oscillation circuit 50 using a multivibrator, and the sensor coil 14, as shown in FIG. 5. This oscillation circuit 50 has an npn transistor 54 with its collector pulled up to a power-supply voltage vcc via a resistor 52 and with its emitter grounded via a capacitor 53, and also has an inverter 55. In this oscillation circuit 50, the emitter output of the npn transistor 54 is inverted by the inverter 55 and the inverted output is fed back to the base of the npn transistor 54 via a resistor. Then, a pulse driving signal is outputted from the inverter 55. The circuit, with such a structure, can be provided at a low cost.

According to the embodiment of the present invention, the sensor core is excited to generate an eddy current in such a manner that the sensor core is not magnetically saturated, considering the material of the sensor core, the number of turns, size and material of the sensor coil, the voltage, current, frequency and signal waveform of the high-frequency electrification. This is because in the present method for measuring the quantity of the magnetic flux, the quantity of the magnetic flux in the magnetic circuit is detected on the basis of an impedance change of the sensor coil caused mainly by the eddy current generated in the sensor core.

Specifically, when the sensor core is excited at a high frequency, an eddy current is generated in the sensor core since the sensor core itself is conductive. As a result, the impedance of the sensor coil will additionally include an impedance change caused by the eddy current with a phase difference of 180 degrees with respect to a driving wave in addition to an impedance change caused by self-induction with a phase difference of 90 degrees with respect to the driving wave. The values of these two changes vary with the permeability $\mu$ of the sensor core material. Particularly, by exciting the sensor core in such a manner that the sensor core is not magnetically saturated, the impedance of the coil depends significantly on the change in eddy current. The impedance made up of a combination of the two changes varies greatly with respect to a change in quantity of the magnetic flux flowing in the sensor core.

The impedance change caused by the eddy current varies with the quantity of the magnetic flux because the quantity of the eddy current varies actually with the permeability $\mu$ of the sensor core. In general, the permeability $\mu$ of a magnetic material is not simply expressed by a constant but varies with the quantity of the magnetic flux.

As described above, in the present method for detecting the magnetic flux, the quantity of the magnetic flux in the magnetic circuit is detected on the basis of the impedance change of the sensor coil caused by the eddy current generated in the sensor core. In the present method, the magnetic material forming the magnetic circuit need not be magnetically saturated unlike the case where the magnetic flux in the magnetic circuit is measured by the supersaturated sensor system. Therefore, a sufficient output can be provided without increasing the quantity of the current flowing through the sensor coil or the number of turns of the wound sensor coil. Moreover, in the present method, since the magnetic material is not magnetically saturated, the influence on the magnetic circuit is very small unlike the supersaturated sensor system.

The change of the impedance of the sensor coil should preferably be set in such a manner that it depends greatly on the eddy current change. This could be attained by increasing the frequency of the driving of the sensor coil. However, if the frequency is too high, the sensor operating point is shifted and the characteristic of the impedance change becomes unstable because of the influence of a capacitance component or the like generated between the windings of the sensor coil, and the characteristic of the impedance change might be deteriorated. Therefore, it is preferable to define the driving conditions appropriately in accordance with the material of the sensor core, the number of turns, size and material of the sensor coil, and so on.

By using a highly permeable magnetic material such as an amorphous metal or permalloy containing a material having a higher permeability than the magnetic circuit, for example, Fe, Co, Si, B or the like as a component, to form the sensor core, or by using a sensor core partly containing such a highly permeable magnetic material, it is possible to improve the magnetization to the sensor core and improve the characteristic of the impedance change.

A specific example of the structure of the sensor core and the sensor coil will now be described.

SPECIFIC EXAMPLE 1

A sensor core with a coil winding part measuring 2 mm in diameter and 10 mm in length and made of pure iron (equivalent to JIS SUYB0) was used. As a sensor coil, a copper wire with a diameter of 60 um was wound on the sensor core. The number of turns of winding was 40 in total, with the wire doubling back at 20 turns.

If a constant current of 10 mA is caused to flow through the sensor coil, an exciting magnetic field generated from the sensor coil is approximately 30 A/m in calculation. It can be said that the sensor core will not be magnetically saturated under such a condition because an exciting magnetic field of approximately 300 to 800 A/m is typically required for magnetic saturation of pure iron. Moreover, it is considered that, practically, excitation is weakened by the influence of partial excitation and a leakage flux. As the sensor coil was actually electrified with a constant current of 10 mA and the magnetization state of the sensor core was examined, the magnetization of the sensor core was found to be approximately 1/100 at the maximum with respect to the maximum magnetization of the pure iron core.

Then, a sine-wave current of ±10 mA was caused to flow through the sensor coil and the frequency of the sine-wave current was sequentially changed. As the sensor impedance and the phase change with respect to the quantity of the magnetic flux at that point were observed, the influence of the eddy current change started to appear at a frequency of approximately 200 kHz and the sensor impedance greatly changed with respect to the change of the quantity of the magnetic flux at a frequency of approximately 500 kHz to 5 MHZ.

In this manner, it can be understood that a sufficient output due to the influence of the eddy current can be provided even with the excitation which is approximately 1/100 of the maximum magnetization of the core.

SPECIFIC EXAMPLE 2

A sensor core which has a coil winding part measuring 2 mm in diameter and 10 mm in length made of permalloy was used. As a sensor coil, a copper wire with a diameter of 60 um was wound on the sensor core. The number of turns of winding was 40 in total, with the wire doubling back at 20 turns.

As the sensor coil was actually electrified with a constant current of 10 mA and the magnetization state of the sensor core was examined, the magnetization of the sensor core was found to be approximately 1/50 at the maximum with respect to the maximum magnetization of permalloy.

Then, a sine-wave current of ±10 mA was caused to flow through the sensor coil and the frequency of the sine-wave current was sequentially changed. As the sensor impedance and the phase change with respect to the quantity of the magnetic flux at that point were observed, the sensor impedance greatly changed with respect to the change of the quantity of the magnetic flux at a frequency of approximately 500 kHz to 5 MHZ, similarly to the case of pure iron.

In this manner, it can be understood that a sufficient output due to the influence of the eddy current can be provided even with the excitation which is approximately 1/50 or 1/100 of the maximum magnetization of the core. However, in the case of permalloy, the impedance is greater than in the case of pure iron because of the difference in the permeability and electrical conductivity. Moreover, since permalloy has a high permeability, the impedance starts to change at a smaller quantity of magnetic flux than in the case of pure iron.

As is clear from the above-described specific examples, in the magnetic material containing iron as a principal component, which is typically used as a core material, it is possible to obtain an impedance change at approximately 500 kHz to 5 MHZ because of the change in eddy current. As is clear from the comparison between pure iron and permalloy, a material with a high permeability may be used to improve the sensitivity.

What is claimed is:

1. A magnetic flux detecting device for measuring the quantity of a magnetic flux in a magnetic path forming part which forms a magnetic path and is provided within a magnetic circuit that is driven by another magnetic flux generating means, the device comprising:

magnetically sensitive means made of a conductive magnetic material and constituted by a sensor core provided on the magnetic path forming part and a sensor coil wound on the sensor core;

high-frequency electrifying means for electrifying the sensor coil at a high frequency; and a magnetic flux quantity detecting means for detecting an impedance of the sensor coil and detecting the quantity of a magnetic flux in the magnetic path forming part on the basis of the impedance;

the sensor core not being magnetically saturated when the sensor coil is electrified at a high frequency by the high-frequency electrifying means;

the electrification of the sensor coil and the detection of the impedance of the sensor coil being performed simultaneously in a single sensor coil.

2. The magnetic flux detecting device as claimed in claim 1, wherein the sensor core is formed by the magnetic path, forming part.

3. The magnetic flux detecting device as claimed in claim 1, wherein part of the magnetic path forming part is split into a plurality of magnetic paths and one of the split magnetic paths is a sensor core.

4. The magnetic flux detecting device as claimed in claim 1, wherein a high permeable magnetic material is used for the sensor core.

5. The magnetic flux detecting device as claimed in claim 1, wherein the high-frequency electrifying means electrifies the sensor coil with pulse wave.

* * * * *

UNITED STATES PATENT AND TRADEMARK OFFICE
CERTIFICATE OF CORRECTION

PATENT NO.     : 6,788,053 B2
DATED          : September 7, 2004
INVENTOR(S)    : Nekado Yasuo et al.

It is certified that error appears in the above-identified patent and that said Letters Patent is hereby corrected as shown below:

Column 10,
Lines 2 and 3, delete "path, forming" and insert -- path forming --.

Signed and Sealed this

Thirtieth Day of November, 2004

JON W. DUDAS
*Director of the United States Patent and Trademark Office*